United States Patent
Harada

(10) Patent No.: US 10,347,561 B2
(45) Date of Patent: Jul. 9, 2019

(54) SEMICONDUCTOR APPARATUS

(71) Applicant: Toshiba Mitsubishi-Electric Industrial Systems Corporation, Chuo-ku (JP)

(72) Inventor: Takaaki Harada, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 15/371,560

(22) Filed: Dec. 7, 2016

(65) Prior Publication Data

US 2017/0084516 A1 Mar. 23, 2017

Related U.S. Application Data

(63) Continuation of application No. PCT/JP2015/062422, filed on Apr. 23, 2015.

(30) Foreign Application Priority Data

Jul. 7, 2014 (JP) .................................. 2014-139572

(51) Int. Cl.
*H02M 7/00* (2006.01)
*H02M 5/458* (2006.01)
(Continued)

(52) U.S. Cl.
CPC .......... *H01L 23/467* (2013.01); *F24F 13/082* (2013.01); *H01L 21/4882* (2013.01);
(Continued)

(58) Field of Classification Search
CPC ..... H05K 7/20145; F24F 13/08; F24F 13/082
See application file for complete search history.

(56) References Cited

U.S. PATENT DOCUMENTS 3,649,430 A * 3/1972 Lewis et al. ......... A47B 96/205
428/138
4,730,233 A * 3/1988 Osterman .......... H05K 7/20572
361/693
(Continued)

FOREIGN PATENT DOCUMENTS

JP 4-217353 8/1992
JP 2007-295748 11/2007
(Continued)

OTHER PUBLICATIONS

International Search Report dated Jul. 21, 2015 in PCT/JP2015/062422 filed Apr. 23, 2015 (with English translation).
(Continued)

*Primary Examiner* — Robert J Hoffberg
(74) *Attorney, Agent, or Firm* — Oblon, McClelland, Maier & Neustadt, L.L.P.

(57) ABSTRACT

A semiconductor apparatus includes a housing in a shape of a panel, a cooling fan configured to exhaust from a top surface of the housing, and provided on the top surface, a partition plate configured to vertically partition a space below the cooling fan into a first space and a second space, and including opening portions through which a cooling airflow produced by the cooling fan passes from the first space to the second space, semiconductor units cooled by the cooling airflow, and vertically disposed in the first space, and a slit plate attached to at least one of the opening portions of the partition plate, and configured to limit an airflow speed of the cooling airflow.

3 Claims, 5 Drawing Sheets

(51) Int. Cl.
*F24F 13/08* (2006.01)
*H05K 7/20* (2006.01)
*H01L 23/467* (2006.01)
*H01L 21/48* (2006.01)
*H02J 9/06* (2006.01)
*H02M 3/00* (2006.01)
*H02M 1/32* (2007.01)

(52) U.S. Cl.
CPC ............ *H02J 9/062* (2013.01); *H02M 7/003* (2013.01); *H05K 7/20145* (2013.01); *H05K 7/20572* (2013.01); *H05K 7/20909* (2013.01); *H01L 2924/0002* (2013.01); *H02M 3/00* (2013.01); *H02M 5/458* (2013.01); *H02M 2001/327* (2013.01)

(56) References Cited

U.S. PATENT DOCUMENTS

| | | | | |
|---|---|---|---|---|
| 4,739,444 | A * | 4/1988 | Zushi | H05K 7/20563 361/691 |
| 5,684,674 | A * | 11/1997 | Yin | G06F 1/20 248/309.1 |
| 5,744,213 | A * | 4/1998 | Nelson | B27M 1/04 312/213 |
| 6,034,870 | A * | 3/2000 | Osborn | G06F 1/20 165/121 |
| 6,272,012 | B1 * | 8/2001 | Medin | G06F 1/20 165/104.26 |
| 6,554,697 | B1 * | 4/2003 | Koplin | G06F 1/18 361/690 |
| 6,557,357 | B2 * | 5/2003 | Spinazzola | G06F 1/20 165/80.3 |
| 6,643,123 | B2 * | 11/2003 | Hartel | H02B 1/565 165/80.3 |
| 6,722,151 | B2 * | 4/2004 | Spinazzola | G06F 1/20 62/259.2 |
| 6,735,079 | B2 * | 5/2004 | Huang | G06F 1/181 165/121 |
| 6,885,554 | B1 * | 4/2005 | Reeck | H05K 7/20572 361/695 |
| 7,046,513 | B2 * | 5/2006 | Nishiyama | H05K 7/20572 165/122 |
| 7,061,715 | B2 * | 6/2006 | Miyamoto | G06F 1/20 360/99.25 |
| 7,215,552 | B2 * | 5/2007 | Shipley | H05K 7/20563 165/104.33 |
| 7,438,638 | B2 * | 10/2008 | Lewis, II | H05K 9/0041 361/679.48 |
| 7,508,663 | B2 * | 3/2009 | Coglitore | H05K 7/20736 165/122 |
| 7,652,891 | B2 * | 1/2010 | Lucero | G06F 1/20 361/752 |
| 7,663,881 | B2 * | 2/2010 | Kuo | G06F 1/20 312/223.2 |
| 7,808,792 | B2 * | 10/2010 | Nguyen | H05K 7/1445 361/679.48 |
| 7,864,541 | B2 * | 1/2011 | Lucero | G06F 1/20 361/679.51 |
| 7,909,902 | B2 * | 3/2011 | Eckberg | B01D 46/10 174/382 |
| 7,995,345 | B2 * | 8/2011 | Nguyen | H05K 7/1445 361/679.48 |
| 8,315,052 | B2 * | 11/2012 | Chan | H05K 7/20736 165/121 |
| 8,373,988 | B2 * | 2/2013 | Chang | H05K 7/20736 361/690 |
| 8,498,115 | B2 * | 7/2013 | Chen | H05K 7/20172 361/695 |
| 8,546,703 | B2 * | 10/2013 | Tang | H05K 5/0213 174/547 |
| 8,634,190 | B2 * | 1/2014 | Nguyen | H05K 7/1445 361/679.5 |
| 2004/0264131 | A1 | 12/2004 | Nishiyama et al. | |
| 2012/0134103 | A1 * | 5/2012 | Tan | H05K 7/20736 361/679.46 |
| 2013/0088833 | A1 * | 4/2013 | Cox | H05K 7/20736 361/689 |
| 2015/0062812 | A1 | 3/2015 | Hwang | |
| 2017/0034948 | A1 * | 2/2017 | Hwang | H05K 7/20572 |

FOREIGN PATENT DOCUMENTS

| | | |
|---|---|---|
| JP | 2012-9636 | 1/2012 |
| JP | 2015-50929 | 3/2015 |

OTHER PUBLICATIONS

Written Opinion dated Jul. 21, 2015 in PCT/JP2015/062422 filed Apr. 23, 2015.
Combined Office Action and Search Report dated Aug. 24, 2018 in Chinese Patent Application No. 201580037403.6, citing document AA therein, 13 pages (with English Translation and English translation of categories of cited documents).

\* cited by examiner

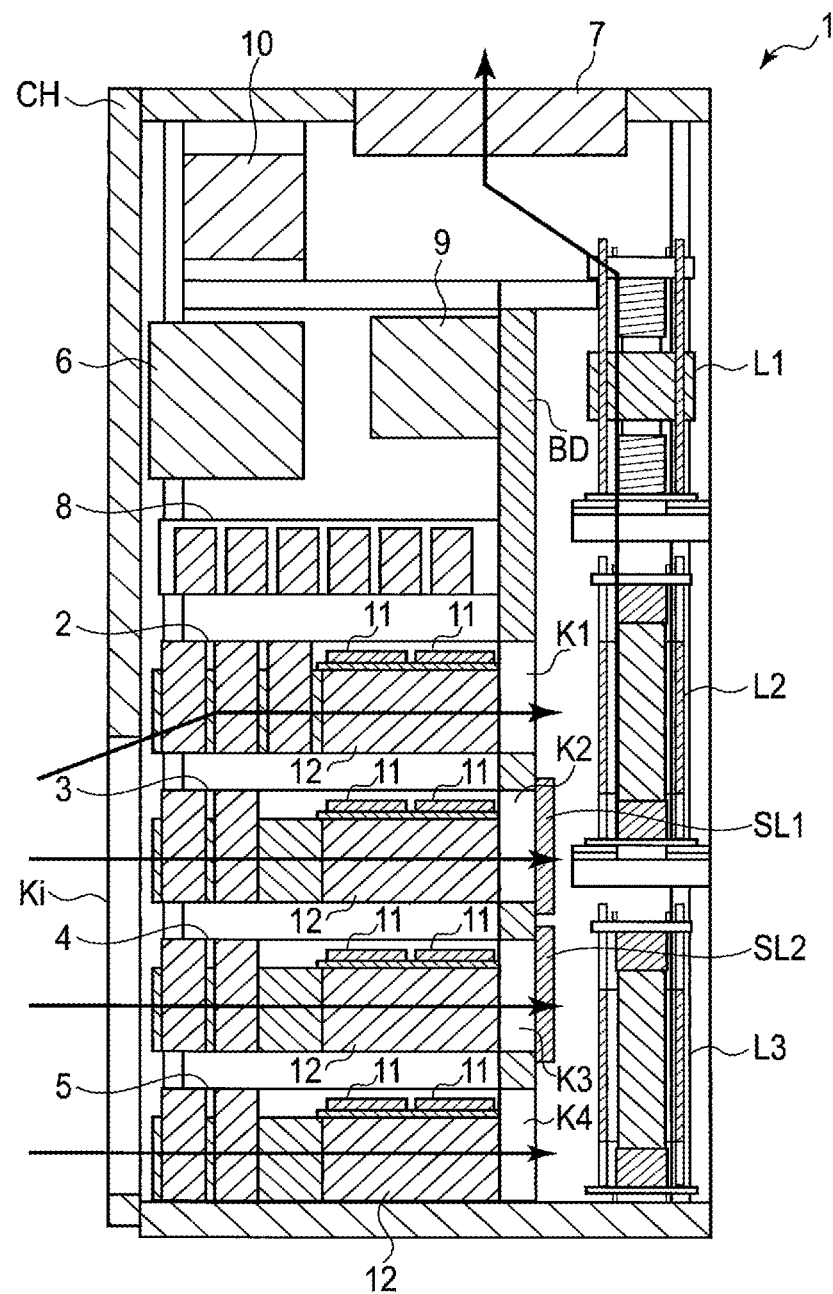
F I G. 1

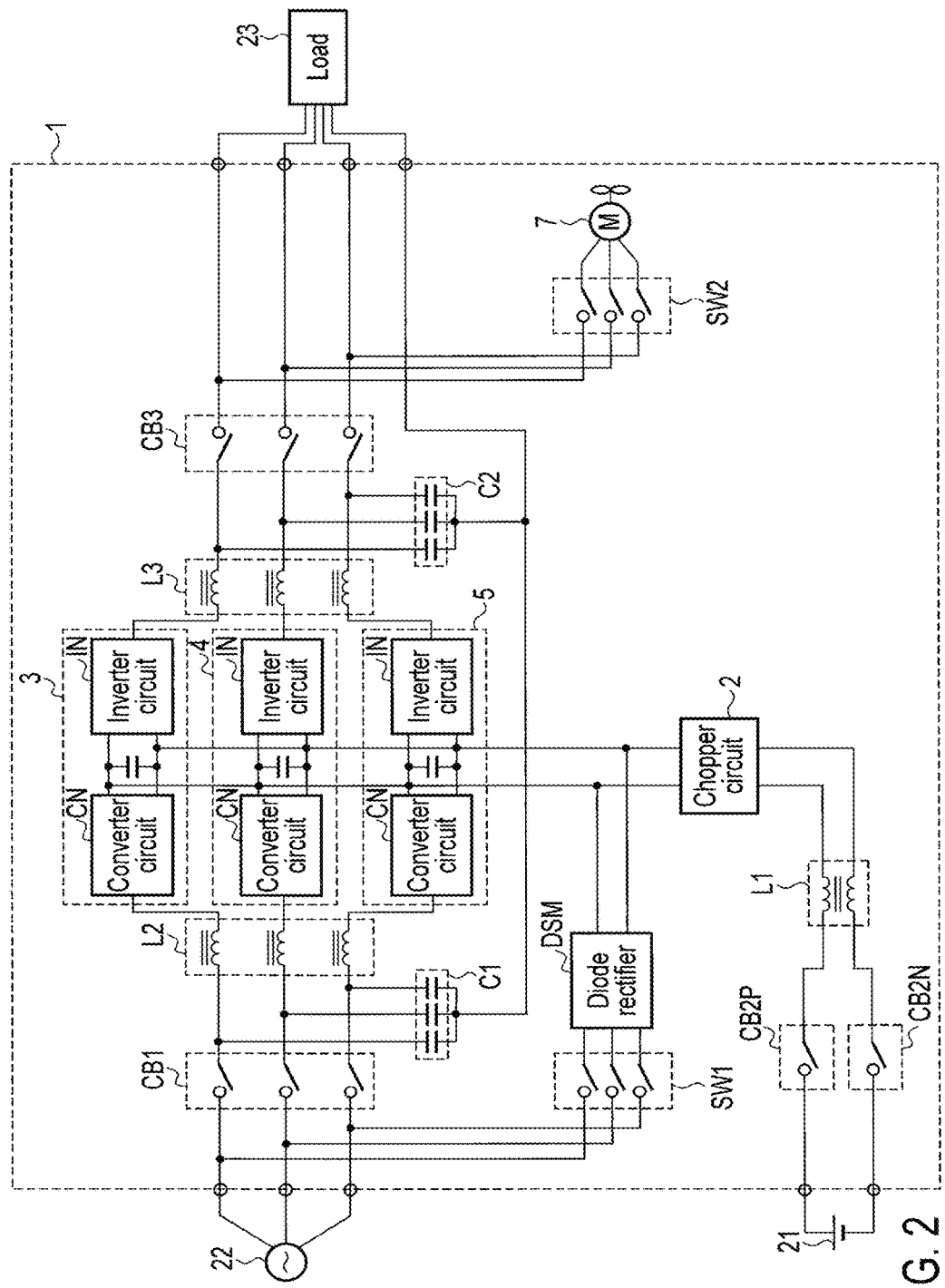
F I G. 2

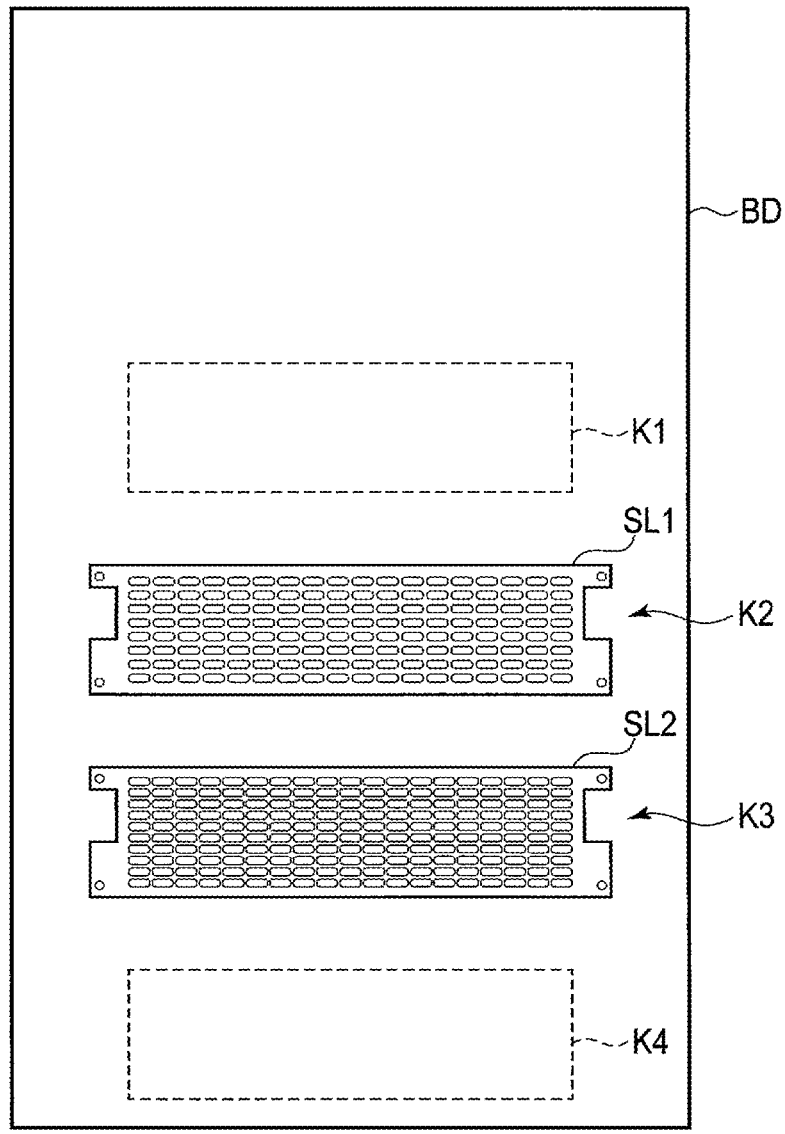
F I G. 3

SEMICONDUCTOR APPARATUS

CROSS REFERENCE TO RELATED APPLICATIONS

This application is a Continuation Application of PCT Application No. PCT/JP2015/062422, filed Apr. 23, 2015 and based upon and claiming the benefit of priority from prior Japanese Patent Application No. 2014-139572, filed Jul. 7, 2014, the entire contents of all of which are incorporated herein by reference.

BACKGROUND OF THE INVENTION

1. Field of the Invention

The present invention relates to a semiconductor apparatus.

2. Description of the Related Art

In general, semiconductor apparatuses composed of semiconductor units in which semiconductors are accommodated are known. The semiconductor apparatuses comprise cooling structures for cooling the semiconductors.

For example, it is disclosed that in a cooling apparatus wherein semiconductor units are stacked into multiple stages to be drawable in an airflow passage and a fan for forced airflow cooling is attached to an upper portion of the airflow passage, a shutter closing a vacant space left after each of the semiconductor units is drawn is provided (see Patent Literature 1).

However, in the case of a semiconductor apparatus wherein semiconductor units are vertically disposed and cooling airflows are exhausted from an upper portion by a cooling fan, the airflow speeds of cooling airflows cooling the semiconductor units at the respective stages are different. Thus, the cooling effects of the respective semiconductor units vary, and the cooling efficiency of the semiconductor apparatus as a whole declines.

CITATION LIST

Patent Literature 1: JP H04-217353 A

BRIEF SUMMARY OF THE INVENTION

An object of the present invention is to provide a semiconductor apparatus wherein the difference between the airflow speeds of the cooling airflows along vertically disposed semiconductor units is reduced.

In accordance with an aspect of the present invention, there is provided a semiconductor apparatus comprises: a housing in a shape of a panel; a cooling fan configured to exhaust from a top surface of the housing, and provided on the top surface; a partition plate configured to vertically partition a space below the cooling fan into a first space and a second space, and including opening portions through which a cooling airflow produced by the cooling fan passes from the first space to the second space; semiconductor units cooled by the cooling airflow, and vertically disposed in the first space; and a slit plate attached to at least one of the opening portions of the partition plate, and configured to limit an airflow speed of the cooling airflow.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a side sectional view showing a structure of an uninterruptible power supply according to an embodiment of the present invention.

FIG. 2 is a circuit diagram showing an electric circuit of the uninterruptible power supply according to the present embodiment.

FIG. 3 is an outline diagram showing an outline in which slit plates are provided on a partition plate according to the present embodiment.

DETAILED DESCRIPTION OF THE INVENTION (Embodiment)

Figure 4:
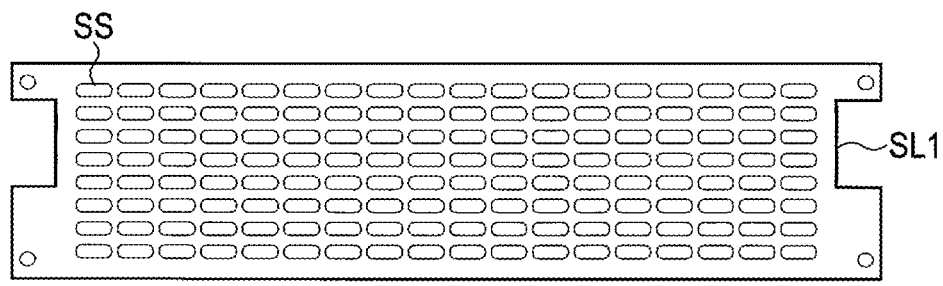
FIG. 4 is an outline diagram showing a slit plate with an opening ratio of 50% according to the present embodiment.

FIG. 1 is a side sectional view showing a structure of an uninterruptible power supply 1 according to an embodiment of the present invention. FIG. 2 is a circuit diagram showing an electric circuit of the uninterruptible power supply 1 according to the present embodiment. The uninterruptible power supply will be herein described, but may be any semiconductor apparatuses in which semiconductors that require cooling are used. The same portions shown in the drawings are denoted by like reference numbers, and the detailed description thereof is omitted. Different portions are mainly explained.

The uninterruptible power supply 1 is a semiconductor apparatus which cools semiconductors by forced airflow cooling. The uninterruptible power supply 1 is of a panel type in which components are accommodated inside a housing CH in the shape of a panel (rectangular parallelepiped), and has a structure for which Underwriters' Laboratories Inc. (UL) certification can be obtained. The uninterruptible power supply 1 supplies a load 23 with AC power supplied from an AC power supply 22 such as a commercial power supply at usual times (at normal times). When a power outage occurs in the AC power supply 22, the load 23 is supplied with DC power supplied from a storage battery 21.

The circuit of the uninterruptible power supply 1 will be described with reference to FIG. 2.

The uninterruptible power supply 1 comprises a chopper circuit (chopper unit) 2, power conversion circuits (converter units) 3, 4, and 5 for three phases, a cooling fan 7, a diode rectifier DSM, an input capacitor C1 for three phases, an output capacitor C2 for three phases, four circuit breakers CB1, CB2P, CB2N, and CB3, three reactors L1, L2, and L3, and two switches SW1 and SW2. The uninterruptible power supply 1 is connected to each of the storage battery 21, the AC power supply 22, and the load 23. The uninterruptible power supply 1 is connected to the AC power supply 22 in a three-phase three-wire system, and connected to the load 23 in a three-phase four-wire system. The power conversion circuits 3 to 5 are provided to correspond to a U-phase, a V-phase, and a W-phase, respectively. The power conversion circuits 3 to 5 are circuits in which DC sides of converter circuits CN and inverter circuits IN are connected by DC links. AC power input from the AC power supply 22 passes through the circuit breaker CB1 and the reactor L2 sequentially, and is input to the power conversion circuits 3 to 5 phase by phase. The power conversion circuits 3 to 5 convert input three-phase AC power into DC power, and convert it into three-phase AC power to be supplied to the load 23. The power conversion circuits 3 to 5 pass the three-phase AC power through the reactor L3 and the circuit breaker CB3 sequentially, and output it to the load 23 and the cooling fan 7. The switch SW2 is provided on an input side of the cooling fan 7. Each phase on an input side of the uninterruptible power supply 1 is connected to a neutral point on an output side of the uninterruptible power supply 1 through the input capacitor C1. Each phase on the output side of the uninterruptible power supply 1 is connected to a neutral point on the output side of the uninterruptible power supply 1 through the output capacitor C2.

The storage battery 21 is a battery storing energy for supplying power at the time of a power outage in the AC power supply 22. At the time of a power outage, DC power output from the storage battery 21 passes through the two circuit breakers CB2P and CB2N, provided at the anode and the cathode, respectively, and the reactor L1 sequentially, and is supplied to the chopper circuit 2. The chopper circuit 2 regulates an input DC voltage, and supplies DC power to the respective DC links of the power conversion circuits 3 to 5. If the storage battery 21 is charged, the diode rectifier DSM converts three-phase AC power input from the AC power supply 22 through the switch SW1 into DC power, and outputs it to the chopper circuit 2. The chopper circuit 2 operates to charge the storage battery 21 with DC power input from the DC links of the power conversion circuits 3 to 5 or the diode rectifier DSM.

The structure in the panel of the uninterruptible power supply 1 will be described with reference to FIG. 1. Arrows in FIG. 1 indicate the flow of cooling airflows.

In the panel of the uninterruptible power supply 1, the chopper unit 2, the three converter units 3 to 5, a control unit 6, the cooling fan 7, a capacitor unit 8, two circuit breaker units 9 and 10, and the three reactors L1, L2, and L3 are mounted. In addition, other elements and devices constituting the electric circuit shown in FIG. 2 are also mounted in the panel of the uninterruptible power supply 1, but are omitted herein.

The inside of the uninterruptible power supply 1 is divided into two spaces: a space in which most of the components are mounted; and a space functioning as an airflow passage through which cooling airflows pass, in which the reactors L1 to L3 are mounted. The cooling fan 7 for forced airflow cooling is provided in a space on a back surface side of a top surface (ceiling surface) of the housing CH. In an upper portion of the uninterruptible power supply 1, the space on the back surface side in which the cooling fan 7 is provided is wider than that on a front surface side. In a lower space occupying most of the inside of the uninterruptible power supply 1, a space on the front surface side is wider than that on the back surface side. The lower space of the uninterruptible power supply 1 is partitioned into the front surface side and the back surface side with a partition plate BD.

The chopper unit 2 and the converter units 3 to 5 (hereinafter, referred to as "semiconductor units 2 to 5") comprise electric circuits composed of switching elements 11 such as insulated-gate bipolar transistors (IGBTs). The switching elements 11 are semiconductors which have a high calorific value and especially require cooling. The switching elements 11 have the shape of a thin plate. The switching elements 11 are provided on top surfaces of cooling fins 12 cooling the switching elements 11. The switching elements 11 and the cooling fins 12 are mounted on back surface sides of the semiconductor units 2 to 5. The semiconductor units 2 to 5 have a structure in which cooling airflows pass through from front surface sides to the back surface sides. The cooling fins 12 are cooled by cooling airflows, and the switching elements 11 are thereby cooled.

The semiconductor units 2 to 5 are all substantially the same in shape, and have the shape of a rectangular parallelepiped with its height shorter (less) than its depth and its width. The semiconductor units 2 to 5 are provided in the lower space on the front surface side of the uninterruptible power supply 1. The depths of the semiconductor units 2 to 5 are a size less than the length between an inner side of a front surface of the uninterruptible power supply 1 and the partition plate BD. Accordingly, front surfaces of the semiconductor units 2 to 5 are in proximity to (or in contact with) the front surface in the panel, and back surfaces of the semiconductor units 2 to 5 are in proximity to (or in contact with) the partition plate BD.

The semiconductor units 2 to 5 are vertically disposed to be stacked into multiple stages, and small gaps exist between the units 2 to 5. The converter unit 5 at the lowest stage is placed to be in contact with a bottom surface of the uninterruptible power supply 1. The converter unit 4 is placed above the converter unit 5. The converter unit 3 is placed above the converter unit 4. The chopper unit 2 at the highest stage of the semiconductor units 2 to 5 is placed above the converter unit 3.

The capacitor unit 8 is a unit in which the input capacitor C1 and the output capacitor C2 shown in FIG. 2 are accommodated. The capacitor unit 8 is substantially the same in shape as the semiconductor units 2 to 5. The capacitor unit 8 is placed above the chopper unit 2.

The control unit 6 is a unit in which a board which controls the uninterruptible power supply 1, etc., is mounted. The control unit 6 is placed on the front surface side above the capacitor unit 8.

The circuit breaker unit 9 is a unit in which the two circuit breakers CB2P and CB2N shown in FIG. 2 are accommodated. The circuit breaker unit 9 is placed on the back surface side above the capacitor unit 8.

The circuit breaker unit 10 is a unit in which the two circuit breakers CB1 and CB3 shown in FIG. 2 are accommodated. The circuit breaker unit 10 is provided in a space adjacent to the front surface side of the space in which the cooling fan 7 is provided.

The reactors L1 to L3 are placed in a space separated with the partition plate BD on the back surface side of the space in which the semiconductor units 2 to 5 are mounted. The reactors L1 to L3 have the shape of a rectangular parallelepiped or a cylinder with its longitudinal dimension arranged vertically. The reactors L1 to L3 are disposed to be vertically stacked. The space in which the reactors L1 to L3 are placed serves as an airflow passage in which cooling airflows exhausted from the space in which the semiconductor units 2 to 5 are mounted move up, and flow to the cooling fan 7.

An air intake Ki of cooling airflows is provided at a place at which the three semiconductor units (converter units) 3 to 5 from the bottom are located in the lower portion of the front surface of the uninterruptible power supply 1. Opening portions K1 to K4 of the partition plate BD are provided to correspond to portions located on the respective back surfaces of the semiconductor units 2 to 5. Cooling airflows taken from the air intake Ki in the front surface pass through the respective semiconductor units 2 to 5 to cool the cooling fins 12, and are exhausted from the respective opening portions K1 to K4 of the partition plate BD to the space on the back surface side of the uninterruptible power supply 1. Cooling airflows exhausted to the space on the back surface side flow upward, and are exhausted from the cooling fan 7 provided on a top surface of the uninterruptible power supply 1.

Figure 5:
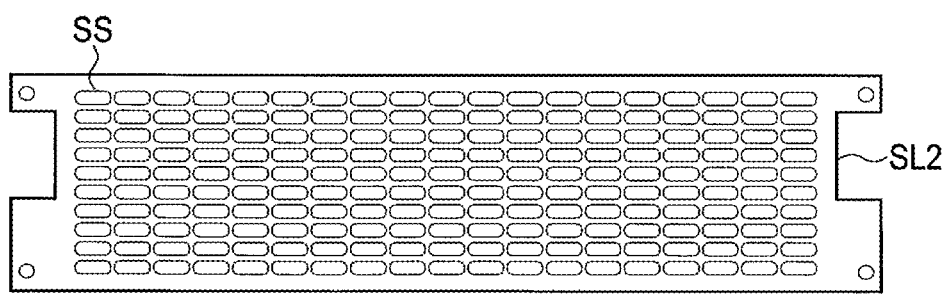
FIG. 5 is an outline diagram showing a slit plate with an opening ratio of 70% according to the present embodiment.

FIG. 3 is an outline diagram showing an outline in which slit plates SL1 and SL2 are provided on the partition plate BD according to the present embodiment. FIG. 4 is an outline diagram showing the slit plate SL1 with an opening ratio of 50%. FIG. 5 is an outline diagram showing the slit plate SL2 with an opening ratio of 70%. The opening ratios herein are percentages on the premise that the opening ratios of the opening portions K1 to K4 with no slit plates provided are 100%.

The highest opening portion K1 and the lowest opening portion K4 of the opening portions K1 to K4 provided in the partition plate BD are not provided with slit plates. That is, the opening ratios of the opening portions K1 and K4 are 100%. The slit plate SL1 with an opening ratio of 50% is attached to the second highest opening portion K2. The slit plate SL2 with an opening ratio of 70% is attached to the third highest opening portion K3. The opening ratios of the slit plates SL1 and SL2 are regulated by the number of slits SS. The opening ratios of the slit plates SL1 and SL2 may be regulated by the size of the slits SS.

Figure 6:
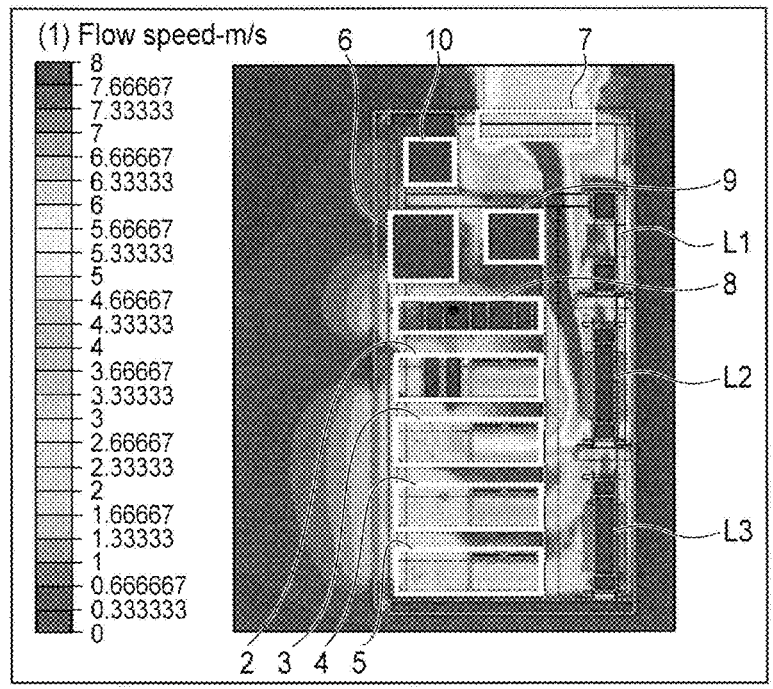
FIG. 6 is an airflow speed distribution diagram showing a result of an airflow speed simulation with the slit plates not provided of cooling airflows in the uninterruptible power supply according to the present embodiment.
Figure 7:
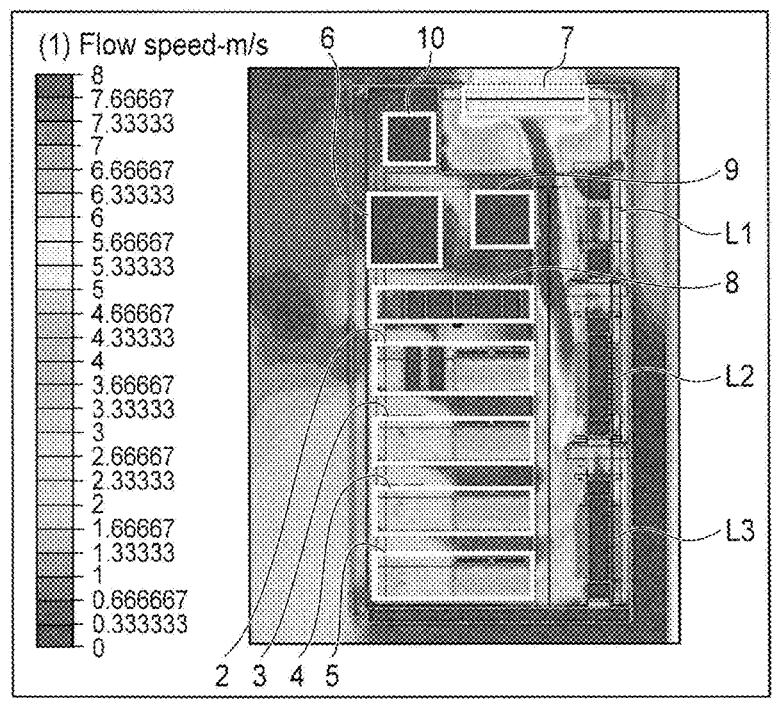
FIG. 7 is an airflow speed distribution diagram showing a result of an airflow speed simulation with the slit plates provided of cooling airflows in the uninterruptible power supply according to the present embodiment.

FIG. 6 is an airflow speed distribution diagram showing a result of an airflow speed simulation with the slit plates SL1 and SL2 not provided of cooling airflows in the uninterruptible power supply 1 according to the present embodiment. FIG. 7 is an airflow speed distribution diagram showing a result of an airflow speed simulation with the slit plates SL1 and SL2 provided of cooling airflows in the uninterruptible power supply 1 according to the present embodiment.

A method of determining the attachment places and the opening ratios of the slit plates SL1 and SL2 will be described with reference to FIG. 6 and FIG. 7. A method of determining the slit plates SL1 and SL2 by conducting a computer simulation will be herein described. The slit plates SL1 and SL2, however, may be determined by measuring the airflow speeds of cooling airflows, empirically determined, or determined by other methods, not by simulation.

With the slit plates SL1 and SL2 not provided, there are variations in the airflow speeds of cooling airflows along the respective semiconductor units 2 to 5. Since the cooling fan 7 is attached to the upper portion of the uninterruptible power supply 1, static pressure becomes greater toward the top as a rule. That is, the airflow speeds of cooling airflows become greater upward. It should be noted that the air intake Ki is located a little lower than the height of the chopper unit 2 located at the top. In contrast, the air intake Ki is located at the respective heights of the other converter units 3 to 5. Accordingly, cooling airflows along the converter units 3 to 5 pass through straight from the front surface sides to the back surface sides of the respective converter units 3 to 5. In contrast, a cooling airflow along the chopper unit 2 is taken into the panel diagonally upward from a little lower side, and then passes through the chopper unit 2. That is, the cooling airflow along the chopper unit 2 does not flow straight (see FIG. 1). Accordingly, although the chopper unit 2 is located higher than the converter unit 3, the airflow speed of the cooling airflow along the chopper unit 2 is lower than that of the cooling airflow along the converter unit 3.

In FIG. 6, the airflow speed of the cooling airflow along the second highest semiconductor unit 3 is the greatest. Thus, the slit plate SL1 with an opening ratio of 50% is attached to the opening portion K2 located on the back surface side of the semiconductor unit 3. The slit plate SL2 with an opening ratio of 70%, which is greater than that of the slit plate SL1 attached to the opening portion K2, is attached to the opening portion K3 located at the third highest semiconductor unit 4. No slit plates are attached to the opening portions K1 and K4 located at the highest semiconductor unit 2 and the lowest semiconductor unit 5, respectively. That is, the opening ratios of the opening portions K1 and K4 are 100%. As the opening ratios of the opening portions K1 to K4 are smaller, the airflow speeds of cooling airflows passing through the opening portion K1 to K4 are more limited.

In this state, if an airflow speed simulation of cooling airflows is conducted, a result as shown in FIG. 7 is obtained. In the result of the airflow speed simulation shown in FIG. 7, cooling airflows along the respective semiconductor units 2 to 5 flow at substantially equal airflow speeds. Therefore, it is determined that the slit plates SL1 and SL2 are attached in this state. If there are variations in the cooling airflows along the respective semiconductor units 2 to 5, the opening ratios of the respective opening portions K1 to K4 are regulated by changing the opening ratios of the slit plates SL1 and SL2 or providing new slit plates. The regulation is repeated until the cooling airflows along all the semiconductor units 2 to 5 become equal.

According to the present embodiment, the airflow speeds of cooling airflows passing through the opening portions K1 to K4 can be limited (regulated) by providing the slit plates SL1 and SL2, which change the opening ratios, at the opening portions K1 to K4 provided in the partition plate BD. The airflow speeds of cooling airflows along the respective semiconductor units 2 to 5 are thereby made equal, and the cooling efficiency of the semiconductor units 2 to 5 can be improved.

For example, in order for all the semiconductor units 2 to 5 to be sufficiently cooled, it is conceivable to select the cooling fan 7 so that the semiconductor unit 5 with the slowest cooling airflow will be sufficiently cooled without using the slit plates SL1 and SL2. In this case, a cooling airflow faster than necessary flows along the semiconductor unit 3, along which the fastest cooling airflow flows. That is, it follows that the cooling fan 7 consumes extra energy. In contrast, the semiconductor units 2 to 5 along which cooling airflows flow faster than necessary can be eliminated by equalizing the airflow speeds of cooling airflows along the respective semiconductor units 2 to 5 using the slit plates SL1 and SL2. Accordingly, the cooling fan 7 having a small capacity can be selected as compared to the above-described case in which the slit plates SL1 and SL2 are not used. This makes it possible to efficiently cool the inside of the panel of the uninterruptible power supply 1 and reduce the manufacturing cost of the uninterruptible power supply 1.

In addition, it is conceivable to equalize the airflow speeds of cooling airflows by changing the shapes of the respective cooling fins 12 of the semiconductor units 2 to 5 without using the slit plates SL1 and SL2. In this case, however, the cooling fins 12 of the converter units 3 to 5 have different shapes, and it is necessary to change the structures of the converter units 3 to 5 for each attachment position. In contrast, by using the slit plates SL1 and SL2, the structures of the converter units 3 to 5 can be uniformed irrespective of the attachment places. By uniforming the structures of the converter units 3 to 5, the productivity of the uninterruptible power supply 1 is improved and the manufacturing cost can be reduced.

Moreover, it is conceivable to change the dimensions (for example, the depth) of the spaces in which the semiconductor units 2 to 5 are mounted, such that the airflow speeds of cooling airflows along the semiconductor units 2 to 5 are equalized, without using the slit plates SL1 and SL2. In this case, there needs to be room which allows the dimensions of the spaces to be changed in the panel of the uninterruptible power supply 1. Further, the housing CH may be greatly changed.

In addition, if the uninterruptible power supply 1 is adapted with a change in its specifications, it is necessary to make each of the semiconductor units 2 to 5 sufficiently cooled also after the adaptation. However, if the frequency or the rated voltage of the uninterruptible power supply 1 changes, each of the semiconductor units 2 to 5 cannot necessarily be cooled as before the adaptation. Accordingly, it is necessary to verify the cooling capacity of each of the semiconductor units 2 to 5 in the adapted uninterruptible power supply 1.

If even one of the semiconductor units 2 to 5 cannot be sufficiently cooled in the adapted uninterruptible power supply 1, it is necessary to adapt the uninterruptible power supply 1 again. Here, if the slit plates SL1 and SL2 are used, the cooling airflows of the semiconductor units 2 to 5 can be easily regulated individually, and the cooling capacity of each of the semiconductor units 2 to 5 can be easily changed. In contrast, if adaptation is made to change the cooling capacity of each of the semiconductor units 2 to 5 without using the slit plates SL1 and SL2, it is necessary to change the structure in the panel or the disposition of devices, or change the shapes of the cooling fins 12 of the semiconductor units 2 to 5. This increases the adaptation cost as compared to the case where the slit plates SL1 and SL2 are attached.

Moreover, in the present embodiment, the cooling of the semiconductor units 2 to 5 has been mainly described; however, other devices and units such as the control unit 6 and the capacitor unit 8 can also be sufficiently cooled by adopting the structures described in the embodiment.

In the embodiment, the structures of the semiconductor units 2 to 5 of stacked in four stages have been described; however, there may be any number of semiconductor units, as long as semiconductor units are stacked in two or more stages. In addition, the opening portions K1 to K4 of the partition plate BD are provided to correspond to the semiconductor units 2 to 5, but may not necessarily be provided to correspond to the semiconductor units 2 to 5, respectively. By providing the opening portions K1 to K4 to make them correspond to the semiconductor units 2 to 5, the cooling capacity of each of the semiconductor units 2 to 5 can be easily regulated. Moreover, there may be any number of opening portions, as long as two or more opening portions are provided. If the number of opening portions is two, the difference between the airflow speeds of cooling airflows passing through the two opening portions can be reduced by attaching a slit plate to one of the opening portions.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Furthermore, constituent elements in the different embodiments may be appropriately combined.

What is claimed is:

1. A semiconductor apparatus comprising:
a housing in a shape of a panel;
a cooling fan configured to exhaust from a top surface of the housing, and provided on the top surface;
a partition plate configured to vertically partition a space below the cooling fan into a first space and a second space, and including opening portions through which a cooling airflow produced by the cooling fan passes from the first space to the second space;
semiconductor units cooled by the cooling airflow, and vertically disposed in the first space; and
a slit plate attached to at least one of the opening portions of the partition plate, and configured to limit an airflow speed of the cooling airflow,
the opening portions opening from the first space into the second space,
slit plates including the slit plate being provided,
the slit plates differing in opening ratio from each other,
the opening ratio of each of the slit plates being regulated by a number of slits,
an air intake of the cooling airflow being provided in a side surface of the housing,
the air intake opening into the first space,
the opening portions including an opening portion having at least a part of which is located higher than the air intake, and
none of the slit plates being attached to the opening portion having the at least said part of which is located higher than the air intake.

2. The semiconductor apparatus of claim 1, wherein the opening portions of the partition plate are provided to correspond to the semiconductor units.

3. A cooling method of a semiconductor apparatus, comprising:
providing a cooling fan configured to exhaust from a top surface of a housing in a shape of a panel on the top surface;
vertically partitioning a space below the cooling fan into a first space and a second space with a partition plate;
providing opening portions through which a cooling airflow produced by the cooling fan passes from the first space to the second space in the partition plate;
providing an air intake of the cooling airflow in a side surface of the housing; and
attaching respective slit plates configured to limit an airflow speed of the cooling airflow to at least two of the opening portions of the partition plate,
the opening portions opening from the first space into the second space,
the slit plates differing in opening ratio from each other, the opening ratio of each of the slit plates being regulated by a number of slits,
the air intake opening into the first space,
the opening portions including an opening portion having at least a part of which is located higher than the air intake, and
none of the slit plates being attached to the opening portion having the at least said part of which is located higher than the air intake.

* * * * *